United States Patent
Yuasa

(10) Patent No.: US 12,288,836 B2
(45) Date of Patent: Apr. 29, 2025

(54) SEMICONDUCTOR LIGHT EMITTING DEVICE INCLUDING CIRCULAR RING-SHAPED METAL RING BODY AND REGULATION HOLES DEFINE BOTTOM OF LENS, AND METHOD FOR MANUFACTURING SAME

(71) Applicant: STANLEY ELECTRIC CO., LTD., Tokyo (JP)

(72) Inventor: Mamoru Yuasa, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 367 days.

(21) Appl. No.: 17/718,653

(22) Filed: Apr. 12, 2022

(65) Prior Publication Data

US 2022/0336717 A1 Oct. 20, 2022

(30) Foreign Application Priority Data

Apr. 16, 2021 (JP) .................................. 2021-070004

(51) Int. Cl.
- *H01L 33/58* (2010.01)
- *H01L 33/00* (2010.01)
- *H01L 33/24* (2010.01)

(52) U.S. Cl.
CPC ............ *H01L 33/58* (2013.01); *H01L 33/005* (2013.01); *H01L 33/24* (2013.01); *H01L 2933/0058* (2013.01)

(58) Field of Classification Search
CPC ....... H01L 33/58; H01L 33/005; H01L 33/24; H01L 2933/0058; H01L 33/54; H01L 33/486; H01L 33/483; H01L 2933/0033
See application file for complete search history.

(56) References Cited

U.S. PATENT DOCUMENTS 7,138,662 B2 * 11/2006 Uemura .................. H01L 33/62
                                                        257/E33.072
8,120,043 B2 * 2/2012 Namioka ............. H05K 3/3442
                                                        257/E33.056

(Continued)

FOREIGN PATENT DOCUMENTS

JP        2001196644 A     7/2001
JP        2006269778 A    10/2006

(Continued)

OTHER PUBLICATIONS

Japanese Office Action (and an English language translation thereof) dated Aug. 13, 2024, issued in counterpart Japanese Application No. 2021-070004.

*Primary Examiner* — Caleb E Henry
(74) *Attorney, Agent, or Firm* — Holtz, Holtz & Volek PC

(57) ABSTRACT

A semiconductor light emitting device includes a plane substrate having a flat substrate surface, a semiconductor light emitting element mounted on the substrate surface, and a lens formed of a resin which embeds the semiconductor light emitting element and condenses light emitted from the semiconductor light emitting element. A circular ring-shaped metal ring body surrounding the semiconductor light emitting element, and a plurality of regulation holes arranged inside the metal ring body at positions rotationally symmetric with respect to the center of the metal ring body are provided on the substrate surface. A bottom of the lens is defined by the metal ring body and the regulation holes. A body part of the lens has a plurality of valley portions extending toward the top of the lens from the positions of the regulation holes. The top of the lens has a surface as a spheroid surface with an axis vertical to the substrate surface and passing through the center of the metal ring body as a major axis.

16 Claims, 8 Drawing Sheets

(56) References Cited

U.S. PATENT DOCUMENTS

| | | | |
|---|---|---|---|
| 8,810,018 B2* | 8/2014 | Ha | H01L 25/0657 |
| | | | 257/E23.001 |
| 8,921,995 B1* | 12/2014 | Railkar | H01L 23/49833 |
| | | | 257/E23.174 |
| 10,153,175 B2* | 12/2018 | Lin | H01L 21/56 |
| 10,461,226 B2* | 10/2019 | Heo | H01L 33/56 |
| 10,475,779 B2* | 11/2019 | Lin | H01L 25/0657 |
| 10,573,626 B1* | 2/2020 | Kim | H01L 33/20 |
| 2006/0108594 A1* | 5/2006 | Iwasaki | H01L 33/58 |
| | | | 257/E33.073 |
| 2007/0230182 A1* | 10/2007 | Tai | F21V 17/06 |
| | | | 257/E33.073 |
| 2008/0001160 A1* | 1/2008 | Andrews | H01L 27/156 |
| | | | 257/79 |
| 2010/0002450 A1* | 1/2010 | Pachler | H01L 33/58 |
| | | | 445/1 |
| 2010/0182792 A1* | 7/2010 | Hsiao | H01L 33/486 |
| | | | 362/310 |
| 2010/0237368 A1* | 9/2010 | Kojima | H01L 33/486 |
| | | | 257/E33.056 |
| 2011/0116252 A1* | 5/2011 | Agatani | H01L 27/15 |
| | | | 29/407.01 |
| 2011/0277813 A1* | 11/2011 | Rogers | H01L 31/0508 |
| | | | 438/57 |
| 2012/0097985 A1* | 4/2012 | Liu | H01L 33/54 |
| | | | 257/E33.059 |
| 2012/0326193 A1* | 12/2012 | Park | H01L 33/44 |
| | | | 257/E33.072 |
| 2013/0327964 A1* | 12/2013 | Otsuka | F21S 41/265 |
| | | | 250/504 R |
| 2014/0103378 A1* | 4/2014 | Lin | H01L 33/58 |
| | | | 257/98 |
| 2014/0367714 A1* | 12/2014 | Taguchi | H01L 33/56 |
| | | | 257/89 |
| 2015/0069438 A1* | 3/2015 | Tong | H01L 33/10 |
| | | | 438/27 |
| 2015/0308633 A1* | 10/2015 | van de Ven | H05B 45/00 |
| | | | 362/231 |
| 2017/0023203 A1* | 1/2017 | Sagisaka | F21S 41/148 |
| 2017/0069792 A1* | 3/2017 | Shibata | H01L 33/22 |
| 2018/0358515 A1* | 12/2018 | Kaneko | H01L 33/504 |
| 2019/0353330 A1* | 11/2019 | Soleimani | F21V 7/04 |
| 2021/0083148 A1* | 3/2021 | Zhang | H01L 33/382 |

FOREIGN PATENT DOCUMENTS

| | | |
|---|---|---|
| JP | 2007081063 A | 3/2007 |
| JP | 2019036692 A | 3/2019 |

\* cited by examiner

| INCIDENT ANGLE ($\theta$ in) | EMISSION ANGLE ($\theta$ out) | INCIDENT ANGLE | EMISSION ANGLE |
|---|---|---|---|
| 4 | 5.68 | 19 | 27.54 |
| 8 | 11.4 | 20 | 29.06 |
| 9 | 12.83 | 26 | 38.50 |
| 14 | 20.09 | 28 | 41.81 |
| 15 | 21.56 | 30 | 45.23 |

SEMICONDUCTOR LIGHT EMITTING DEVICE INCLUDING CIRCULAR RING-SHAPED METAL RING BODY AND REGULATION HOLES DEFINE BOTTOM OF LENS, AND METHOD FOR MANUFACTURING SAME

BACKGROUND OF THE INVENTION

1. Field of the Invention

The present invention relates to a semiconductor light emitting device and a method for manufacturing the same, and particularly to a semiconductor light emitting device having a resin lens and a method for manufacturing the same.

2. Description of the Related Art

Semiconductor light emitting devices in each of which a semiconductor light emitting element is provided with a lens have heretofore been widely put into practical use. There have been known, for example, an infrared light source for a sensor, a light source for a camera used for autofocus or the like, an exterior light source for a vehicle, or a light source for headlights, etc.

There has been disclosed in, for example, Patent Literature 1 (Japanese Patent Application Laid-Open No. 2007-81063), a light emitting device which emits a lot of parallel light which brightly and evenly illuminates an irradiation target by a reflective surface formed in a recess portion of a substrate, a light emitting element, and a convex lens which seals the top of the substrate.

Further, there has been disclosed in Patent Literature 2 (Japanese Patent Application Laid-Open No. 2006-269778), an optical device provided with a dome type resin lens body and a protective wall which covers the circumference of the resin lens body. There has been disclosed in Patent Literature 3 ((Japanese Patent Application Laid-Open No. 2001-196644), a light semiconductor device provided with a convex lens-shaped sealing resin which seals a light semiconductor element.

SUMMARY OF THE INVENTION

However, when forming a lens by injecting a resin, difficulty occurs in providing a semiconductor light emitting device large in forward emitted light intensity in narrow light distribution characteristics. Further, a problem arises in that due to the deviation during molding, the lens is misaligned with respect to the light emitting element is displaced, so that a desired light distribution cannot be obtained.

The present invention has been made in view of the above-described points, and it is an object of the present invention to provide a semiconductor light emitting device which is excellent in directivity characteristic with a simple structure and large in intensity of forward emitted light, and a manufacturing method thereof. Further, it is another object of the present invention to provide a semiconductor light emitting device which is suppressed in positional and optical axis deviations between a light emitting element and an optical element and has a highly accurate light distribution characteristic, and a manufacturing method thereof.

A semiconductor light emitting device according to one aspect of the present invention includes a plane substrate having a flat substrate surface, a semiconductor light emitting element mounted on the substrate surface, and a lens formed of a resin which embeds the semiconductor light emitting element and condenses light emitted from the semiconductor light emitting element. A circular ring-shaped metal ring body surrounding the semiconductor light emitting element and a plurality of regulation holes arranged inside the metal ring body at positions rotationally symmetric with respect to the center of the metal ring body are provided on the substrate surface. A bottom of the lens is defined by the metal ring body and the regulation holes. A body part of the lens has a plurality of valley portions extending toward the top of the lens from the positions of the regulation holes. The top of the lens has a surface of a spheroid with an axis vertical to the substrate surface and passing through the center of the metal ring body as a major axis.

A method for manufacturing a semiconductor light emitting device according to another aspect of the present invention, including a plane substrate having a flat substrate surface, and a semiconductor light emitting element mounted on the substrate surface, includes the steps of:

(a) forming on the substrate surface, a circular ring-shaped metal ring body which surrounds the semiconductor light emitting element, and a plurality of regulation holes arranged inside the metal ring body at positions rotationally symmetric with respect to the center of the metal ring body, (b) potting a lens resin inside the metal ring body from above the metal ring body, and (c) curing the lens resin subjected to the potting.

DESCRIPTION OF THE PREFERRED EMBODIMENTS

Figure 1:
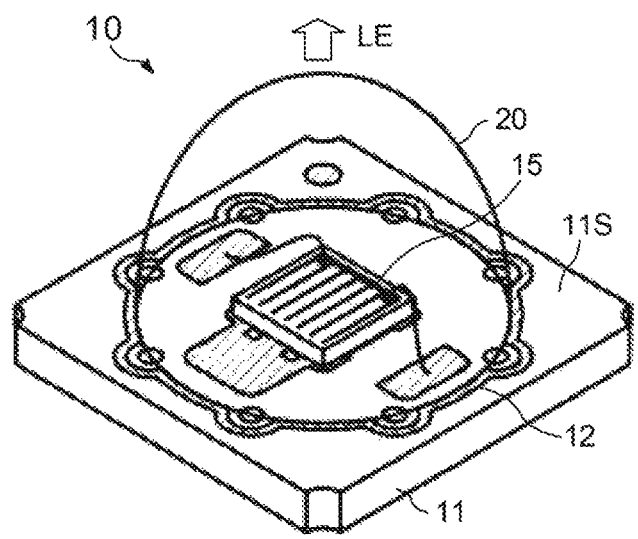
FIG. 1 is a perspective view of a semiconductor light emitting device according to a first embodiment of the present invention, and is a see-through view which sees through its internal structure.

Hereinafter, preferred embodiments of the present invention will be described, but these may be appropriately modified and combined. Further, in the following description and accompanying drawings, substantially the same or equivalent parts will be given the same reference numerals and described.

First Embodiment

Figure 2A:
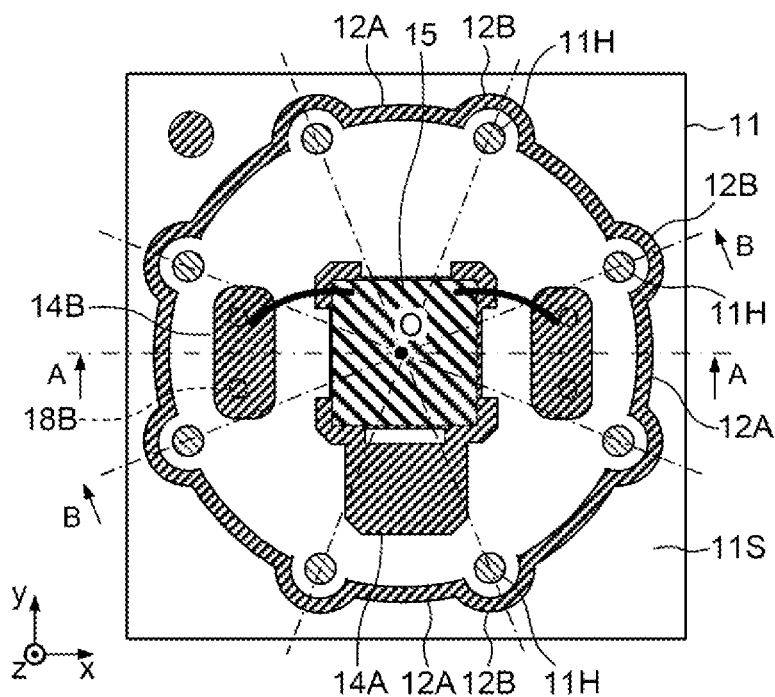
FIG. 2A is a top view schematically showing the internal structure of the semiconductor light emitting device 10 according to the first embodiment.
Figure 2B:
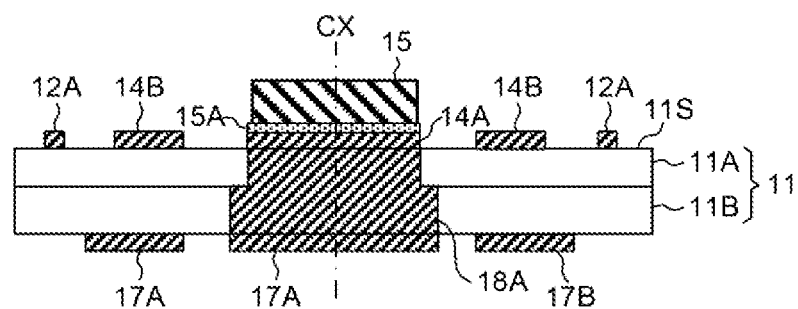
FIG. 2B is a cross-sectional view schematically showing a cross section of the semiconductor light emitting device 10 taken along line A-A of FIG. 2A.
Figure 2C:
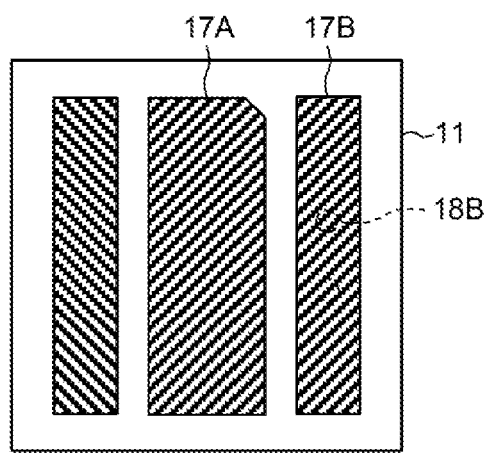
FIG. 2C is a plan view schematically showing the back surface of the semiconductor light emitting device 10.

FIG. 1 is a perspective view of a semiconductor light emitting device 10 according to a first embodiment of the present invention, and is a see-through view that sees through its internal structure. Further, FIG. 2A is a top view schematically illustrating the internal structure of the semiconductor light emitting device 10. FIG. 2B is a cross-sectional view schematically showing a cross-section of the semiconductor light emitting device 10 taken along line A-A of FIG. 2A. FIG. 2C is a plan view schematically showing the back surface of the semiconductor light emitting device 10.

As shown in FIG. 1, the semiconductor light emitting device 10 includes a substrate 11, a metal ring body 12 provided on a substrate surface 11S of the substrate 11, and a lens 20 provided on the inner edge portion of the metal ring body 12. A semiconductor light emitting element 15 is mounted on the substrate surface 11S (light emitting element mounting surface). The semiconductor light emitting element 15 is embedded inside the lens 20.

(Substrate and Electrode)

FIG. 2A shows the internal structure of the semiconductor light emitting device 10 when viewed from the vertical direction to the substrate 11 (when seen from the top view). Note that the lens 20 is not shown. There is shown that the substrate surface 11S (upper surface) of the substrate 11 is parallel to an xy plane, and the side surface of the substrate 11 is parallel to an x direction and a y direction.

As shown in FIGS. 1 and 2A, the substrate 11 is a plate-like substrate flat in the substrate surface 11S. In the present embodiment, the substrate 11 is configured as a parallel plate-shaped substrate. Further, as shown in FIGS. 2A and 2B, the metal ring body 12 which is a frame edge metal layer fixed to the substrate surface 11S is provided on the substrate 11.

The substrate 11 is, for example, a Low Temperature Co-fired Ceramics (LTCC) substrate formed of, for example, Alumina Nitride (AlN) or Alumina ($Al_2O_3$) and is formed by laminating an upper layer substrate 11A and a lower layer substrate 11B. Incidentally, the substrate 11 is not limited to the ceramics substrate. A printed wiring substrate such as a glass epoxy substrate may be used.

Further, a first wiring electrode (for example, anode electrode) 14A and a second wiring electrode (for example, cathode electrode) 14B each of which is a wiring electrode in the semiconductor light emitting device 10 are provided on the substrate 11 (hereinafter, when not particularly distinguished, each will be referred to as a wiring electrode 14).

As shown in FIGS. 2B and 2C, a first mounting electrode 17A and a second mounting electrode 17B (hereinafter, when not particularly distinguished, each will be referred to as a mounting electrode 17) respectively connected to the first wiring electrode 14A and the second wiring electrode 14B are provided on the back surface of the substrate 11.

Specifically, the first wiring electrode 14A and the second wiring electrode 14B are respectively connected to the first mounting electrode 17A and the second mounting electrode 17B through internal wirings (not shown) provided between metal vias 18A and 18B (hereinafter, when not particularly distinguished, each is referred to as a metal via 18) and between the upper layer substrate 11A and the lower layer substrate 11B.

The wiring electrode 14 and the mounting electrode 17 are, for example, copper/nickel/gold (Cu/Ni/Au). Further, the metal via 18 is copper (Cu). The copper parts of the wiring electrode 14, the mounting electrode 17 and the metal via 18 can also be a copper alloy, tungsten (W), a tungsten alloy, silver (Ag), or a silver alloy. Incidentally, the copper parts may be appropriately selected depending on the base material of the substrate 11.

The semiconductor light emitting element 15 is connected to the wiring electrode 14, so that the mounting electrode 17 is energized to radiate emitted light LE to the outside.

(Semiconductor Light Emitting Element)

In the present embodiment, the semiconductor light emitting element 15 is an aluminum gallium phosphorous (AlGaP) based LED (Light Emitting Diode) which emits infrared light having a light emitting wavelength ranging from about 935 to 955 nm. However, the semiconductor light emitting element 15 is not limited to it, but may be a semiconductor light emitting element which radiates visible light and ultraviolet light.

Further, a phosphor plate may be placed on the semiconductor light emitting element 15. Even in this case, the emitted light from the phosphor plate has a Lambertian light distribution in a manner similar to the emitted light from the semiconductor light emitting element 15.

(Metal Ring Body 12 and Hole 11H)

The metal ring body 12 has a circular ring shape when viewed from the vertical direction to the substrate 11 (when seen from the top view). More specifically, the metal ring body 12 has a circular ring-shaped body part 12A, and protrusion parts 12B each being a semi-circular ring-shaped metal layer connected to the body part 12A so as to protrude from the body part 12A to the outside at a position (i.e., vertex position of a regular octagon) rotationally symmetric by 45° with respect to the center O of the body part 12A. The body part 12A and the protrusion parts 12B of the metal ring body 12 are continuously connected.

A circular hole 11H being a recessed portion of the substrate 11 is provided inside the protrusion part 12B. The hole 11H is not limited to the case where it is provided at the position rotationally symmetric by 45°, but may be arranged at the vertex position of the regular n-sided polygon (where n: an integer). Incidentally, the number of vertices n (number n of holes 11H) is preferably 5 to 18-angled shapes that enable the height of the lens 20 to be high. Preferably, 8 to 12-angled shapes are preferable. When the number of angles is smaller than 5, the shape of the lens 20 becomes distorted, and the orientation in the top view of the lens is disturbed. This is because further, when the number of angles is more than 18, the lens becomes approximately circular in the top view, and the height of the lens 20 cannot be made high.

Figure 2D:
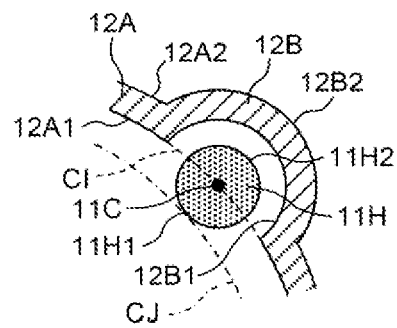
FIG. 2D is a top view showing in an enlarged scale, a body part 12A and a protrusion part 12B of a metal ring body 12, and a portion of a hole 11H.

FIG. 2D is a top view showing in an enlarged scale, the body part 12A and the protrusion part 12B of the metal ring body 12, and the portion of the hole 11H of the substrate 11.

The hole 11H is provided in the substrate 11 as a cylindrical-shaped recessed portion and provided inside the protrusion part 12B of the metal ring body 12. Further, the holes 11H provided at the plural protrusion parts 12B respectively have the same shape and size.

More specifically, the hole 11H has a diameter smaller than that of a substrate inner edge portion (hereinafter simply called an inner edge portion) 12B1 of the circular ring-shaped protrusion part 12B and is provided away from the inner edge portion 12B1. The surface of the hole 11H is preferably smooth.

As will be described later, the hole 11H functions as a regulation hole for a lens resin at lens formation and functions to define the shape of the lens 20. The position and size of the hole 11H can be determined as appropriate depending on the shape of the lens 20, i.e., desired light distribution characteristics.

Incidentally, assuming that an inner edge portion 12A1 of the body part 12A of the metal ring body 12 has a circular shape, and the corresponding circle is CI (broken line in the drawing), at least the center 11C of the hole 11H is preferably arranged to be located on the circle CI or outward in radius. When the center 11C of the hole 11H is located inside the radius of the circle CI, the lens resin flows between the inner edge portion 12B1 of the protrusion part 12B and an outer edge portion 11H2 of the hole 11H, so that it may not be possible to regulate the lens 20 by the hole 11H.

Further, the radius of a hole inscribed circle CJ (indicated by a dashed line in the drawing) tangent to each of the inner edge portions 11H1 of the holes 11H is preferably 0.9 times or more and less than 1.0 times the radius of the circle CI. In the present embodiment, the radius thereof is set to 0.94 times. Incidentally, this is because in the case where the radius of the hole inscribed circle CJ is too small, the lens resin flows into the hole 11H, so that the lens resin cannot be regulated by the hole 11H.

Incidentally, in the circular ring-shaped body part 12A of the metal ring body 12, the inner edge portion 12A1 thereof may have a circular shape. Also, the inner edge portion 11H1 of the hole 11H is not limited to the circular shape, but preferably has a circular shape or an elliptical shape. Further, the shape of the protrusion part 12B of the metal ring body 12 is not limited to the circular ring shape, but preferably has a circular shape or an elliptical shape.

Incidentally, when a laminated substrate such as LTCC is used for the substrate 11, a through hole is formed in the uppermost layer (the upper layer substrate 11A in the case of the present embodiment) to form the hole 11H, which may be laminated with a substrate layer in a lower layer.

(Lens 20)

Figure 3A:
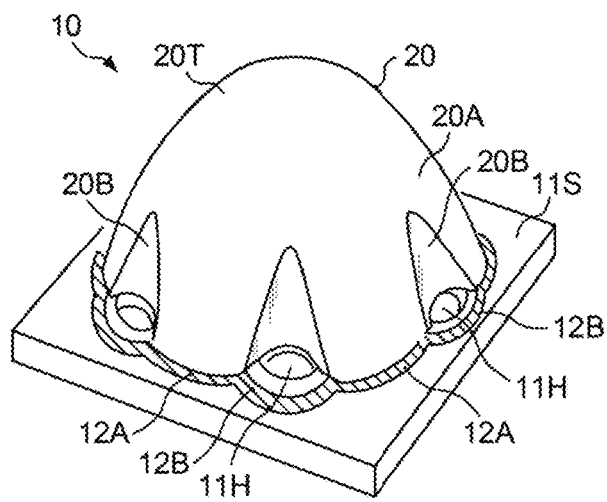
FIG. 3A is a perspective view schematically showing the outer appearance of the semiconductor light emitting device 10, particularly a lens 20.
Figure 3B:
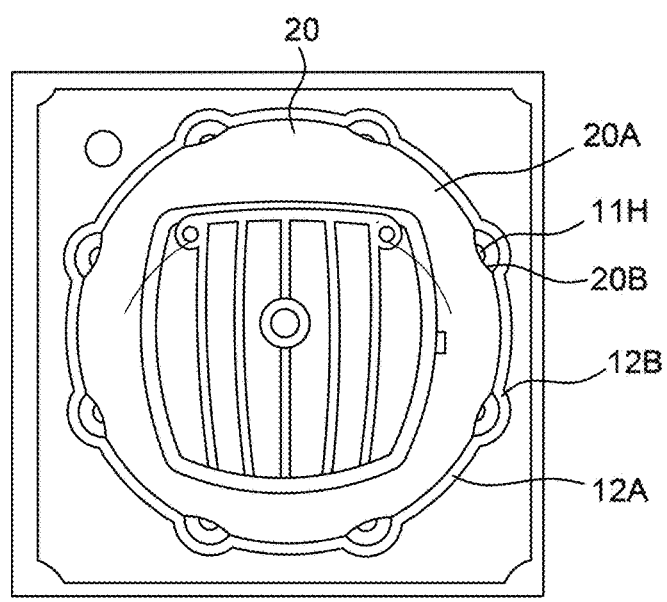
FIG. 3B is a photograph of the semiconductor light emitting device 10 taken from the direction vertical to a substrate 11.

FIG. 3A is a perspective view schematically showing the outer appearance of the semiconductor light emitting device 10, particularly the lens 20, and FIG. 3B is a photograph of the semiconductor light emitting device 10 taken from above (the direction vertical to the substrate 11).

The lens 20 has a lens body part 20A which is a body part of the lens 20. The lens body part 20A has valley portions 20B each extending from the position of the hole 11H serving as the regulation hole toward the leading end (or tip) of the lens 20. The valley portion 20B is reduced in depth and width from the surface of the lens 20 toward the leading end thereof and disappears in the middle of the lens body part 20A.

More specifically, the lens 20 is formed by potting the resin, but the lens resin is regulated by the inner edge portion 12A1 of the body part 12A of the metal ring body 12 to form the lens body part 20A. Further, the lens resin is regulated by the inner edge portion 11H1 of the hole 11H to form the valley portion 20B.

The lens body part 20A has a spheroid shape with an axis CX (refer to FIGS. 2A and 2B) vertical to the substrate surface 11S and passing through the center O as a central axis, and the lens 20 functions as a spheroid surface lens.

Figure 4A:
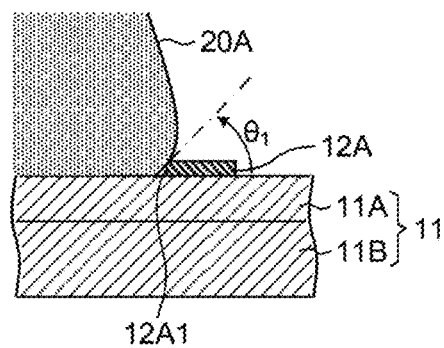
FIG. 4A is a cross-sectional view showing in an enlarged scale, a contact portion between an inner edge portion 12A1 of the body part 12A of the metal ring body 12 and a lens body part 20A.

FIG. 4A is a cross-sectional view showing in an enlarged scale, a contact portion between the inner edge portion 12A1 of the body part 12A of the metal ring body 12 and the lens body part 20A. At the contact portion, the lens resin is regulated by the inner edge portion 12A1 of the body part 12A of the metal ring body 12 and swells so as to cover the body part 12A of the metal ring body 12, whereby the lens body part 20A is formed so as to form an acute angle $\theta_1$ ($0<\theta_1<90°$) with respect to the surface of the substrate 11 at the contact portion.

Figure 4B:
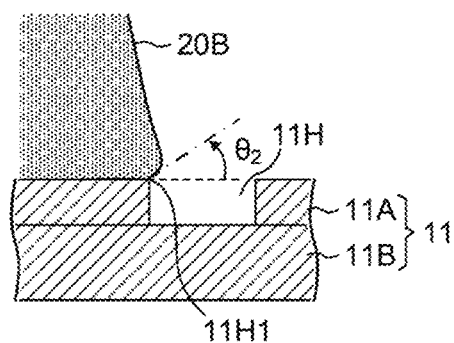
FIG. 4B is a cross-sectional view showing in an enlarged scale, a contact portion between an inner edge portion 11H1 of the hole 11H and a valley portion 20B of the lens 20.

Further, FIG. 4B is a cross-sectional view showing in an enlarged scale, a contact portion between the inner edge portion 11H1 of the hole 11H and the valley portion 20B of the lens 20. At the contact portion, the lens resin is regulated by the inner edge portion 11H1 of the hole 11H, whereby the valley portion 20B of the lens is expanded and formed so as to form an acute angle $\theta_2$ ($0<\theta_2<90°$) with respect to the surface of the substrate 11 at the contact portion In addition, the volume (Vlens) of the lens resin is preferably larger than the volume (Vci) of a hemisphere with the circle CI defined by the inner edge portion 12A1 of the body part 12A of the metal ring body 12 as the bottom face and less than or equal to 1.9 times the Vci. In the present embodiment, Vlens is set to 1.34 times the Vci. Incidentally, this is because when Vlens is Vci or less, the lens surface 20S of the lens 20 does not become a spheroid surface (aspheric surface), and when Vlens is 1.9 times or higher of Vci, the hole 11H is filled with the lens resin. Incidentally, it is preferable to set Vlens to more than 1.3 times the Vci in order to obtain high directivity.

The lens resin is bent (folded) by the provision of the hole 11H to form the valley portion 20B in the lens 20, so that the height of the lens 20 can be held high. Further, the lens body part can be made into a form close to a cylindrical shape. Thus, since it is possible to form the lens high in height from the semiconductor light emitting element 15 and whose front part takes an ellipsoidal shape, it is possible to form the semiconductor light emitting device 10 which has narrow angle light distribution characteristics and is large in forward light intensity.

(Manufacturing Method of Lens 20)

First, the substrate 11 mounted with the semiconductor light emitting element 15 was prepared. The metal ring body 12 and the circular-shaped hole 11H surrounding the semiconductor light emitting element 15 were formed on the substrate surface 11S of the substrate 11.

Next, a resin (lens resin) used as the sealing lens 20 is potted inside the metal ring body 12 from above the substrate 11. As the lens resin, a methyl-based silicone resin with a viscosity of 63 Pa·s, which contains 0.2 wt % nanosilica was used. The lens resin may be phenyl-based in addition to the methyl type, or they can also be mixed and used. Incidentally, when using an environment exposed to ultraviolet light, or when using the light emitting element 15 that emits ultraviolet light and blue light, a saturated alkyl-based silicone resin such as the methyl-based silicone resin is preferred.

In the case of potting, the lens resin was slowly supplied from a resin supply nozzle and at the same time, the nozzle was raised. For example, the supply amount of the resin was 0.012 ml/sec, and the rising speed of the nozzle was 1.1 mm/sec.

After potting, the resin was allowed to stand and adapted to the substrate. Next, it was heated for 15 to 30 minutes at 150° C., and the lens resin was cured. With the above, the lens 20 having a spheroid surface was completed.

In the present invention, since the lens resin is bent (folded) after potting by the metal ring body 12 and the hole 11H provided in the substrate 11, the height of the lens 20 can be held high even in the process of standing or resin curing after potting, and the lens 20 can be formed which is high in height from the semiconductor light emitting element 15 and in which its front part (lens surface 20S) is the spheroid surface (aspheric surface).

In particular, since the inner surface of the hole 11H is approximately 90° with respect to the substrate surface 11S, it is possible to prevent the lens resin from flowing in the hole 11H at the inner edge portion 11H1 of the hole and to form each valley portion 20B in the lens 20.

Also, since the lens 20 is formed by self-alignment during standing or resin curing, a positional deviation between the semiconductor light emitting element 15 and the lens 20 and an optical axis deviation therebetween are suppressed to be extremely small, whereby the semiconductor light emitting device 10 having highly accurate light distribution characteristics is obtained.

Further, it becomes easy to maintain the shape until curing after potting by using as the lens resin, a resin having a viscosity (or thixo property) of a predetermined value or higher. However, when the viscosity of the resin is increased too much, the adhesion between the semiconductor light emitting element 15 and the upper surface of the substrate 11, and a self-alignment property may be impaired. Therefore, an excessive increase in viscosity is not preferred. In other words, the lens 20 which has no optical axis deviation and is high in height from the semiconductor light emitting element 15, and in which its front part is the spheroid surface, can be formed without extremely increasing the viscosity of the lens resin. Further, at the same time, the present method is an excellent lens forming method capable of sealing the semiconductor light emitting element 15 with the lens resin.

(Ray Locus of Emitted Light)

Figure 5A:
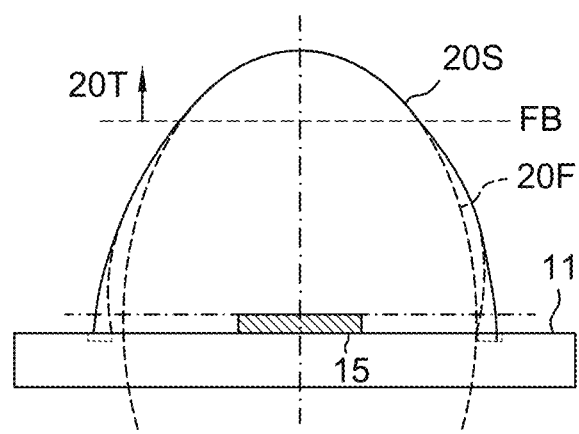
FIG. 5A is a photograph showing a cross section of the lens 20 manufactured by a method of the first embodiment.

FIG. 5A is a photograph showing the cross-section of the lens 20 manufactured by the method of the present embodiment. A fitting ellipsoid 20F fitted to the surface (lens surface 20S) of the lens body part 20A being a spheroid surface and the lens surface 20S is shown. Further, an elliptical fitting boundary line FB is shown but is about 70% of the total height of the lens 20.

A top portion (hereinafter called a top 20T) of the lens 20 above the elliptical fitting boundary line FB fits very well on the spheroid surface. Incidentally, the flat ratio of the corresponding ellipse was 0.35. That is, the top 20T of the lens 20 has a surface as a spheroid surface with an axis CX vertical to the substrate surface 11S and passing through the center O of the metal ring body 12 as a major axis. Although its details will be described later, a directivity characteristic is obtained which is relatively flat in light intensity in the central part and is top-hat shaped where the elliptical fitting boundary line FB is 50% or more, and the flat ratio is 0.4 or more.

Figures 5B, 5C:
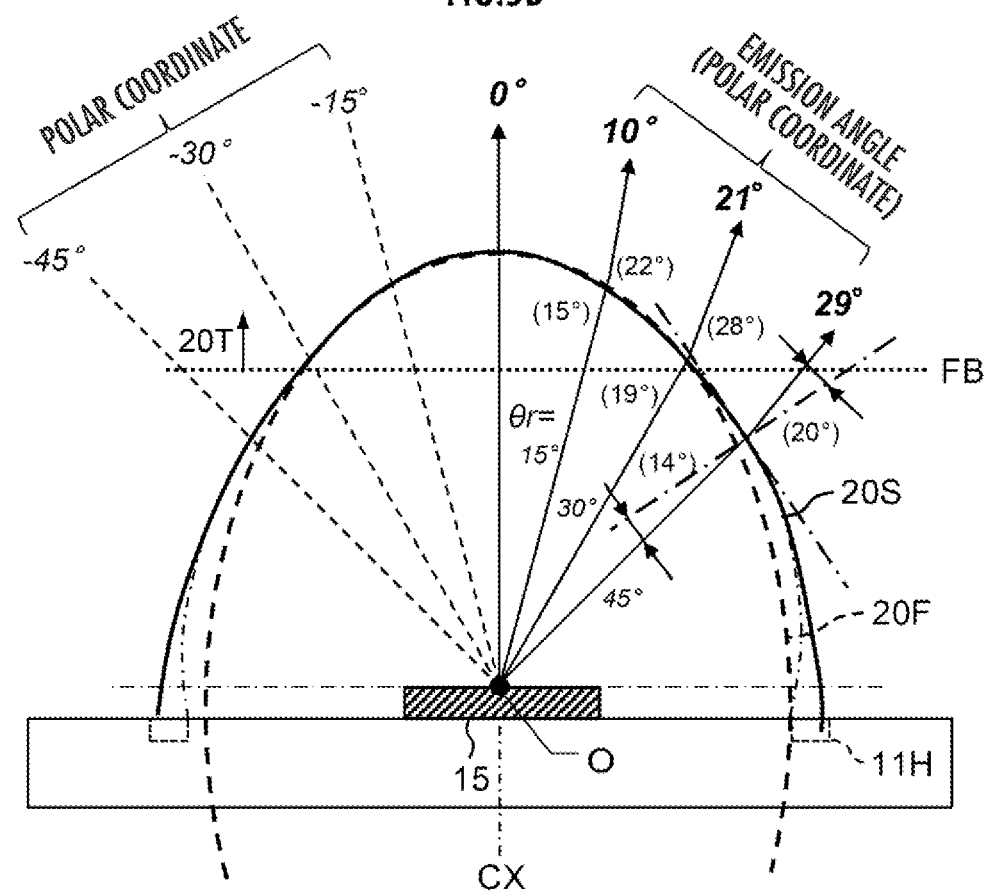
FIG. 5B is a view showing loci and emission angles of light rays emitted from the center O of a semiconductor light emitting element 15.
FIG. 5C is a view showing an incident angle ($\theta_{in}$) and an emission angle ($\theta_{out}$) with an emission surface (lens surface 20S) as the reference.

FIG. 5B shows loci and emission angles of light rays emitted from the center O of the semiconductor light emitting element 15. An incident angle ($\theta_{in}$) and an emission angle ($\theta_{out}$) with an emission surface (lens surface 20S) as a reference, and an emission angle with a polar coordinate Or (the optical axis of the lens 20 being 0°) as a reference are shown in FIG. 5B. Incidentally, in the drawing, the incident angle ($\theta_{in}$) and the emission angle ($\theta_{out}$) are shown as the values given in parentheses. Further, FIG. 5C is a table showing the incident angle ($\theta_{in}$) and the emission angle ($\theta_{out}$) with the emission surface (lens surface 20S) as the reference.

Referring to FIGS. 5B and 5C, for example, regarding the lights (solid lines in the drawing) emitted at 15°, 30°, and 45° respectively on the polar coordinate basis from the center O of the semiconductor light emitting element 15, the incident angles ($\theta_{in}$) to the lens surface 20S are 15°, 19°, and 14° respectively, and the emission angles ($\theta_{out}$) are 22°, 28°, and 20° respectively. Further, the emission angles of these emitted lights on the polar coordinate basis from the lens surface 20S are 10°, 21°, and 29° respectively.

Thus, it is understood that the emitted lights from the center O of the semiconductor light emitting element 15 are condensed in the direction of the optical axis CX of the lens 20 by the top 20T of the lens 20 which is the spheroid surface. Specifically, it is understood that the lights emitted at angles of −30° to +30° from the center O of the semiconductor light emitting element 15 are condensed at an angle (polar coordinate basis) within ±21°.

Figure 5D:
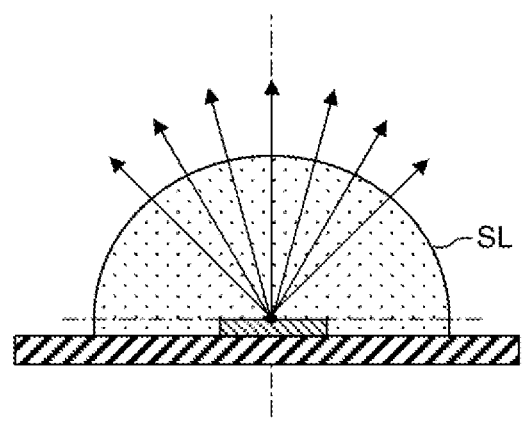
FIG. 5D is a view showing loci and directivity characteristics of light rays of a spherical lens as a comparative example.

Incidentally, FIG. 5D is a comparative example showing the case of a spherical lens and is a view showing loci and directivity characteristics of light rays. In the case of the present embodiment, a top hat-like directivity characteristic to be described later is obtained in which a luminous flux emitted from the lens is condensed in an optical axis direction and which is strong in the front direction of the lens and weak in the lateral direction. On the other hand, in the case of the spherical lens SL, since its lens surface is approximately at right angles to the radiation luminous flux of the LED, the directivity characteristic of the LED is reflected.

Figure 6A:
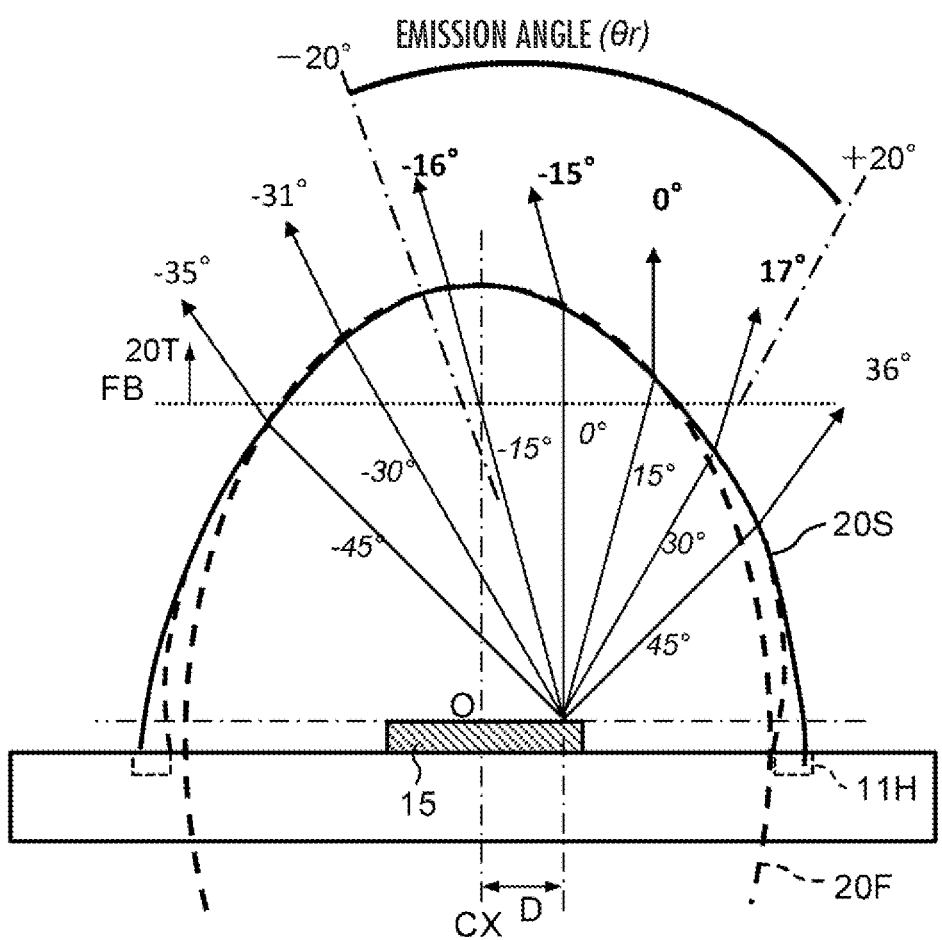
FIG. 6A is a view showing loci and emission angles of light rays emitted from the end of the semiconductor light emitting element 15.
Figure 6B:
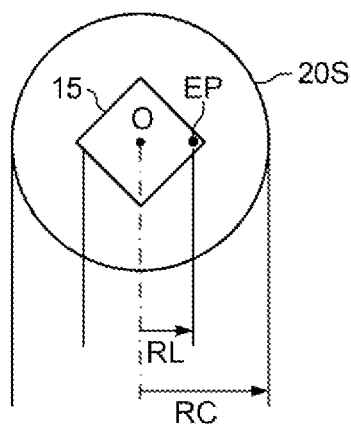
FIG. 6B is a top view showing the relationship of arrangement of the lens body part 20A and the semiconductor light emitting element 15.

FIG. 6A shows loci and emission angles of light rays emitted from the end of the semiconductor light emitting element 15. FIG. 6B is a top view showing the relationship of arrangement of the lens body part 20A and the semiconductor light emitting element 15.

The semiconductor light emitting element 15 has a square shape when viewed from above. The center thereof coincides with the center O of the lens body part 20A. FIG. 6A shows the loci of the light rays emitted from an end EP (the position of RL as viewed from the center) on the diagonal line of the semiconductor light emitting element 15. Incidentally, the length of the diagonal line (2×RL) of the semiconductor light emitting element 15 is about ⅓ of the diameter (2×RC) of the lens body part 20A.

Specifically, there are shown loci of light rays emitted from the end EP of the semiconductor light emitting element 15 at −45°, −30°, −15°, 0°, 15°, 30°, and 45° respectively. It is understood that the emitted rays from the end EP of the semiconductor light emitting element 15 are condensed in the direction of the optical axis CX of the lens 20 by the top 20T of the lens 20 which is the spheroid surface. Specifically, it is understood that lights emitted from the end EP of the semiconductor light emitting element 15 at angles of −15° to +30° are condensed at an angle within ±20°.

Thus, it is possible to give the lens 20 directivity characteristics sufficiently satisfactory even for a light source having a real size. When the size of the semiconductor light emitting element is too large, some of the emitted lights is trapped inside the lens, and the output is caused to be lowered. Therefore, when the length of the diagonal line of the semiconductor light emitting element is taken as an element size, the element size is preferably within ⅓ of the diameter of the base (bottom) of the lens 20.

(Directivity Characteristics)

FIGS. 7A through 7D are graphs showing directivity characteristics of the semiconductor light emitting device when the viscosity of the lens resin (silicone resin or the like) in the above potting, and the ascending speed of the nozzle to supply the resin are changed.

Figure 7A:
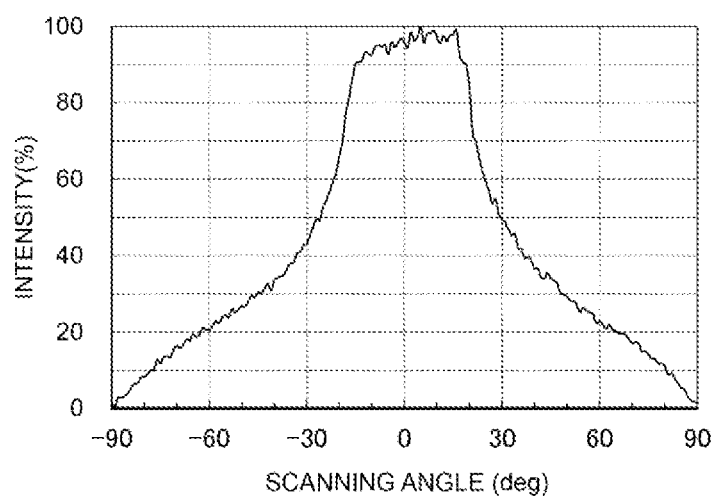
FIG. 7A is a graph showing directivity characteristics of a sample 1.
Figure 7B:
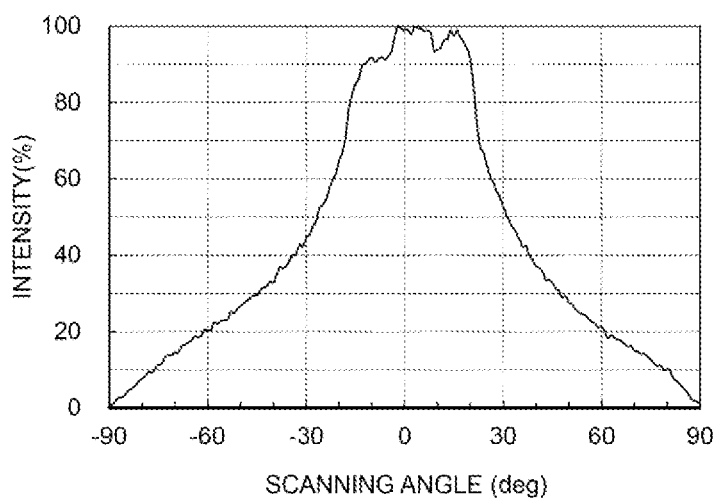
FIG. 7B is a graph showing directivity characteristics of a sample 2.
Figure 7C:
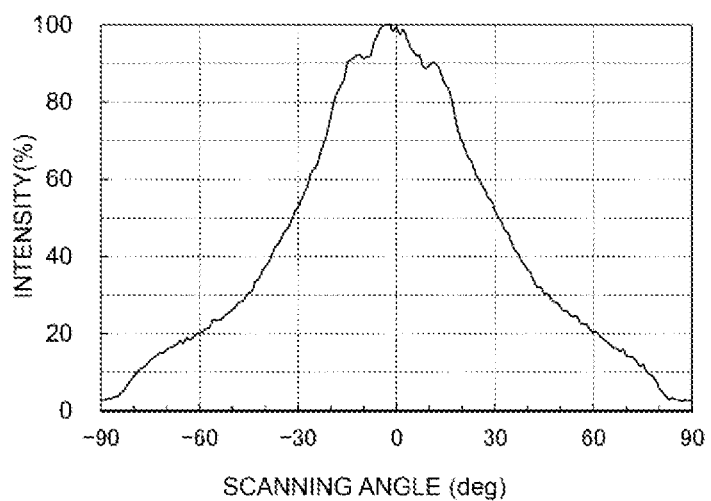
FIG. 7C is a graph showing directivity characteristics of a sample 3.
Figure 7D:
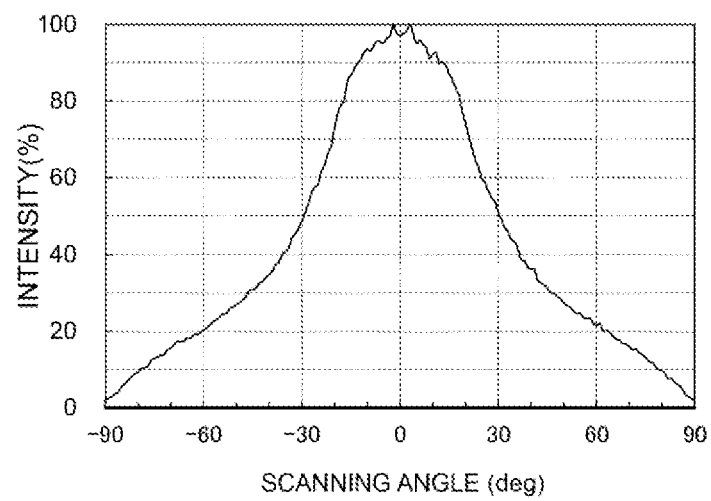
FIG. 7D is a graph showing directivity characteristics of a sample 4.

FIG. 7A is the directivity characteristic of a sample 1 prepared with the resin viscosity of 63 Pa·s and the nozzle ascending speed of 1.1 mm/sec both shown in the aforementioned manufacturing method. FIGS. 7B, 7C, and 7D respectively show the directivity characteristics of a sample 2 with [reference viscosity and high speed], a sample 3 with [low viscosity and reference speed], and a sample 4 with [low viscosity and high speed] on the basis of the resin viscosity of the sample 1 and the nozzle ascending speed. Note that the horizontal axis is indicated by an angle (Scanning Angle (deg)), and the vertical axis is indicated by normalized light intensity. Further, the samples 1 to 4 are made same in potting resin volume (Vlens).

In the cases shown in FIGS. 7A and 7B, a so-called top hat-like directivity characteristic is obtained in which the light intensity rises sharply within ±30°, and the light intensity is relatively flat in its central part. In the cases shown in FIGS. 7C and 7D, a parabolic shaped directivity characteristic is shown in which the rise of light intensity is slow and the light intensity has a peak in its central part. Thus, when the resin having the reference viscosity is used, a top hat-like directivity characteristic can be obtained with a good spheroid-shaped lens even if there is a slight difference in the ascending speed of the nozzle. Further, if the resin viscosity is set lower than the reference value, the directivity characteristic can be weakened.

Further, the elliptical fitting boundary lines FB of the samples 1 and 2 are as high as around about 70% of the total height of the lens 20, and the flat ratio of the fitting ellipse is large (aspheric surface). On the other hand, the elliptical fitting boundary lines FB of the samples 3 and 4 are as low as 40% to 50% of the total height of the lens 20, and the flat ratio of the fitting ellipse is also small (close to the spherical surface). That is, according to the method of the present embodiment, the shape of the lens surface 20S can be made into the spheroid surface (aspheric surface) by setting the viscosity of the lens resin to the predetermined value, and hence the directivity characteristic can be obtained which is strong in light intensity in the central part of the directivity characteristic and is top hat-shaped.

As described in detail above, according to the semiconductor light emitting device of the present invention and its manufacturing method, there can be provided a semiconductor light emitting device which is excellent in directivity characteristic with a simple structure and large in intensity of forward emitted light, and its manufacturing method. Further, it is possible to provide a semiconductor light emitting device which is suppressed in positional and optical axis deviations between a light emitting element and an optical element, and has a highly accurate light distribution characteristic, and its manufacturing method.

DESCRIPTION OF REFERENCE NUMERALS

10: semiconductor light emitting device
11: substrate
11A: upper layer substrate
11B: lower layer substrate
11H: regulation hole
11S: substrate surface
12: metal ring body
12A: body part of metal ring body
12B: protrusion parts of the metal ring body
14: wiring electrode
15: semiconductor light emitting element
17: mounting electrode
20: lens
20A: lens body part
20B: valley portion

What is claimed is:

1. A semiconductor light emitting device comprising:
a plane substrate having a flat substrate surface;
a semiconductor light emitting element mounted on the substrate surface; and
a lens formed of a resin which embeds the semiconductor light emitting element and condenses light emitted from the semiconductor light emitting element, and
wherein a circular ring-shaped metal ring body is provided on the surface of the substrate and forms a ring-shaped frame surrounding the semiconductor light emitting element such that the semiconductor light emitting element is arranged inside the ring-shaped metal ring body, and
wherein a plurality of regulation holes which are recessed portions of the substrate are provided on the substrate surface and are arranged on the substrate surface inside the metal ring body at positions rotationally symmetric with respect to a center of the metal ring body,
wherein a bottom of the lens is defined by the metal ring body and the regulation holes,
wherein a body part of the lens has a plurality of valley portions which are recessed portions from a surface of the lens and extend toward the top of the lens from the positions of the regulation holes, and
wherein the top of the lens has a surface of a spheroid with an axis vertical to the substrate surface and passing through the center of the metal ring body as a major axis.

2. The semiconductor light emitting device according to claim 1, wherein the metal ring body has a circular ring-shaped body part, and a plurality of protrusion parts connected to the body part so as to protrude from the body part to the outside at positions rotationally symmetric with respect to the center of the body part, and
wherein the regulation holes are provided inside the protrusion parts.

3. The semiconductor light emitting device according to claim 1, wherein the regulation holes have a cylindrical shape.

4. The semiconductor light emitting device according to claim 2, wherein the regulation holes have a cylindrical shape.

5. The semiconductor light emitting device according to claim 1, wherein the valley portions are reduced in depth and width toward a leading end the top of the lens from the surface of the lens.

6. The semiconductor light emitting device according to claim 2, wherein the valley portions are reduced in depth and width toward a leading end the top of the lens from the surface of the lens.

7. A semiconductor light emitting device comprising:
a plane substrate having a flat substrate surface;
a semiconductor light emitting element mounted on the substrate surface; and
a lens formed of a resin which embeds the semiconductor light emitting element and condenses light emitted from the semiconductor light emitting element,
wherein a circular ring-shaped metal ring body surrounding the semiconductor light emitting element and a plurality of regulation holes arranged inside the metal ring body at positions rotationally symmetric with respect to the center of the metal ring body are provided on the substrate surface,
wherein a bottom of the lens is defined by the metal ring body and the regulation holes,
wherein a body part of the lens has a plurality of valley portions extending toward the top of the lens from the positions of the regulation holes,
wherein the top of the lens has a surface of a spheroid with an axis vertical to the substrate surface and passing through the center of the metal ring body as a major axis, and
wherein the plane substrate is a low-temperature fired laminated ceramic substrate.

8. The semiconductor light emitting device according to claim 1, wherein the lens is a silicone resin containing nanosilica.

9. A method for manufacturing a semiconductor light emitting device comprising: a plane substrate having a flat substrate surface; a semiconductor light emitting element mounted on the substrate surface; and a lens formed of a resin which embeds the semiconductor light emitting element and condenses light emitted from the semiconductor light emitting element, wherein a circular ring-shaped metal ring body surrounding the semiconductor light emitting element and a plurality of regulation holes arranged inside the metal ring body at positions rotationally symmetric with respect to the center of the metal ring body are provided on the substrate surface, wherein a bottom of the lens is defined by the metal ring body and the regulation holes, wherein a body part of the lens has a plurality of valley portions extending toward the top of the lens from the positions of the regulation holes, wherein the top of the lens has a surface of a spheroid with an axis vertical to the substrate surface and passing through the center of the metal ring body as a major axis, the method comprising:
(a) providing, on the substrate surface, the circular ring-shaped metal ring body which surrounds the semiconductor light emitting element, and the plurality of regulation holes arranged inside the metal ring body at positions rotationally symmetric with respect to the center of the metal ring body;
(b) potting a lens resin inside the metal ring body from above the metal ring body; and
(c) curing the lens resin subjected to the potting.

10. The method for manufacturing the semiconductor light emitting device according to claim 9, wherein the lens resin is comprised of one kind of resin.

11. The semiconductor light emitting device according to claim 1, wherein an inner edge portion of the metal ring body and the body part of the lens are in contact with each other.

12. The semiconductor light emitting device according to claim 11, wherein the body part of the lens is in contact with the inner edge portion of the metal ring body at a contact portion in which the body part of the lens swells so as to cover the metal ring body and forms an acute angle $\theta_1$ ($0<\theta_1<90°$) with respect to the surface of the plane substrate.

13. The semiconductor light emitting device according to claim 1, wherein an inner edge portion of each of the regulation holes and the body part of the lens are in contact with each other.

14. The semiconductor light emitting device according to claim 13, wherein the body part of the lens is in contact with the inner edge portion of each of the regulation holes at a contact portion in which the body part of the lens swells and forms an acute angle $\theta_2$ ($0<\theta_2<90°$) with respect to the surface of the plane substrate.

15. The semiconductor light emitting device according to claim 2,
wherein each of the protrusion parts has a semi-circular shape, and
wherein each of the regulation holes has a diameter smaller than an inner edge portion of each of the protrusion parts.

16. The semiconductor light emitting device according to claim 1, wherein the regulation holes are provided away from the metal ring body.

* * * * *